United States Patent
Lin et al.

(10) Patent No.: US 9,153,542 B2
(45) Date of Patent: Oct. 6, 2015

(54) SEMICONDUCTOR PACKAGE HAVING AN ANTENNA AND MANUFACTURING METHOD THEREOF

(75) Inventors: I-Chia Lin, Tainan (TW); Sheng-Jian Jou, Huwei Township (TW); Han-Chee Yen, Taipei (TW)

(73) Assignee: Advanced Semiconductor Engineering, Inc. (TW)

( * ) Notice: Subject to any disclaimer, the term of this patent is extended or adjusted under 35 U.S.C. 154(b) by 267 days.

(21) Appl. No.: 13/564,702

(22) Filed: Aug. 1, 2012

(65) Prior Publication Data
US 2014/0035097 A1 Feb. 6, 2014

(51) Int. Cl.
*H01L 27/08* (2006.01)
*H01L 23/552* (2006.01)
(Continued)

(52) U.S. Cl.
CPC .............. *H01L 23/552* (2013.01); *H01L 23/66* (2013.01); *H01L 24/97* (2013.01); *H01Q 21/0087* (2013.01); *H01Q 21/064* (2013.01); *H01Q 21/065* (2013.01); *H01L 21/568* (2013.01); *H01L 23/295* (2013.01); *H01L 23/3135* (2013.01); *H01L 24/16* (2013.01); *H01L 24/48* (2013.01); *H01L 2223/6627* (2013.01); *H01L 2223/6677* (2013.01); *H01L 2224/16225* (2013.01); *H01L 2224/48227* (2013.01); *H01L 2224/97* (2013.01); *H01L 2924/15192* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01);

(Continued)

(58) Field of Classification Search
CPC ............ H01L 24/97; H01L 2225/1041; H01L 2225/1047
USPC ........................................................ 257/531
See application file for complete search history.

(56) References Cited

U.S. PATENT DOCUMENTS

| 3,761,782 A | 9/1973 | Youmans |
| 4,394,712 A | 7/1983 | Anthony |

(Continued)

FOREIGN PATENT DOCUMENTS

| JP | 8288686 A2 | 1/1996 |
| JP | 2002246540 A | 8/2002 |

(Continued)

OTHER PUBLICATIONS

Wang et al., "TSV Technology for 2.5D Solution", 2012 Electronic Components and Technology Conference, San Diego, California, May 29-Jun. 1, 2012.

(Continued)

*Primary Examiner* — Long K Tran
(74) *Attorney, Agent, or Firm* — Morgan Law Offices, PLC

(57) ABSTRACT

A semiconductor package and a manufacturing method thereof are provided. The semiconductor package includes a first substrate, a second substrate, an interposer substrate, a semiconductor chip, a package body and a first antenna layer. The first substrate comprises a grounding segment. The interposer substrate is disposed between the second substrate and the first substrate. The semiconductor chip is disposed on the second substrate. The package body encapsulates the second substrate, the semiconductor chip and the interposer substrate, and has a lateral surface and an upper surface. The first antenna layer is formed on the lateral surface and the upper surface of the package body, and electrically connected to the grounding segment.

17 Claims, 21 Drawing Sheets

(51) Int. Cl.
  *H01L 23/66* (2006.01)
  *H01Q 21/00* (2006.01)
  *H01Q 21/06* (2006.01)
  *H01L 23/29* (2006.01)
  *H01L 23/31* (2006.01)
  *H01L 21/56* (2006.01)
  *H01L 23/00* (2006.01)

(52) U.S. Cl.
  CPC . *H01L2924/3011* (2013.01); *H01L 2924/3025* (2013.01)

(56) References Cited

U.S. PATENT DOCUMENTS

| | | |
|---|---|---|
| 4,499,655 A | 2/1985 | Anthony |
| 4,569,786 A | 2/1986 | Deguchi |
| 4,807,021 A | 2/1989 | Okumura |
| 4,814,205 A | 3/1989 | Arcilesi et al. |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian |
| 5,166,772 A | 11/1992 | Soldner et al. |
| 5,191,405 A | 3/1993 | Tomita et al. |
| 5,229,647 A | 7/1993 | Gnadinger |
| 5,239,448 A | 8/1993 | Perkins et al. |
| 5,308,443 A | 5/1994 | Sugihara |
| 5,353,498 A | 10/1994 | Fillion et al. |
| 5,355,016 A | 10/1994 | Swirbel et al. |
| 5,404,044 A | 4/1995 | Booth et al. |
| 5,557,142 A | 9/1996 | Gilmore et al. |
| 5,615,477 A | 4/1997 | Sweitzer |
| 5,639,989 A | 6/1997 | Higgins, III |
| 5,643,831 A | 7/1997 | Ochiai et al. |
| 5,677,511 A | 10/1997 | Taylor et al. |
| 5,694,300 A | 12/1997 | Mattei et al. |
| 5,776,798 A | 7/1998 | Quan et al. |
| 5,886,876 A | 3/1999 | Yamaguchi |
| 5,895,229 A | 4/1999 | Carney et al. |
| 5,998,292 A | 12/1999 | Black et al. |
| 5,998,867 A | 12/1999 | Jensen et al. |
| 6,093,972 A | 7/2000 | Carney et al. |
| 6,150,193 A | 11/2000 | Glenn |
| 6,225,694 B1 | 5/2001 | Terui |
| 6,276,599 B1 | 8/2001 | Ogawa |
| 6,329,631 B1 | 12/2001 | Yueh |
| 6,376,769 B1 | 4/2002 | Chung |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,586,822 B1 | 7/2003 | Vu et al. |
| 6,614,102 B1 | 9/2003 | Hoffman et al. |
| 6,670,269 B2 | 12/2003 | Mashino |
| 6,686,649 B1 | 2/2004 | Mathews et al. |
| 6,699,787 B2 | 3/2004 | Mashino |
| 6,740,546 B2 | 5/2004 | Corisis et al. |
| 6,740,950 B2 | 5/2004 | Paek |
| 6,740,959 B2 | 5/2004 | Alcoe et al. |
| 6,757,181 B1 | 6/2004 | Villanueva |
| 6,781,231 B2 | 8/2004 | Minervini |
| 6,812,549 B2 | 11/2004 | Umetsu et al. |
| 6,815,348 B2 | 11/2004 | Mashino |
| 6,828,656 B2 | 12/2004 | Forbes et al. |
| 6,838,776 B2 | 1/2005 | Leal et al. |
| 6,865,084 B2 | 3/2005 | Lin et al. |
| 6,881,896 B2 | 4/2005 | Ebihara |
| 6,917,526 B2 | 7/2005 | Ajioka et al. |
| 6,962,829 B2 | 11/2005 | Glenn et al. |
| 6,962,869 B1 | 11/2005 | Bao et al. |
| 6,998,532 B2 | 2/2006 | Kawamoto et al. |
| 7,030,469 B2 | 4/2006 | Mahadevan et al. |
| 7,045,385 B2 | 5/2006 | Kim et al. |
| 7,078,269 B2 | 7/2006 | Yamasaki et al. |
| 7,081,661 B2 | 7/2006 | Takehara et al. |
| 7,109,410 B2 | 9/2006 | Arnold et al. |
| 7,125,744 B2 | 10/2006 | Takehara et al. |
| 7,129,422 B2 | 10/2006 | Arnold |
| 7,134,198 B2 | 11/2006 | Nakatani et al. |
| 7,157,372 B1 | 1/2007 | Trezza |
| 7,161,252 B2 | 1/2007 | Tsuneoka et al. |
| 7,180,012 B2 | 2/2007 | Tsuneoka et al. |
| 7,186,928 B2 | 3/2007 | Kikuchi et al. |
| 7,187,060 B2 | 3/2007 | Usui |
| 7,214,889 B2 | 5/2007 | Mazurkiewicz |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,327,015 B2 | 2/2008 | Yang et al. |
| 7,334,326 B1 | 2/2008 | Huemoeller et al. |
| 7,342,303 B1 | 3/2008 | Berry et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,451,539 B2 | 11/2008 | Morris et al. |
| 7,478,474 B2 | 1/2009 | Koga |
| 7,482,272 B2 | 1/2009 | Trezza |
| 7,488,903 B2 | 2/2009 | Kawagishi et al. |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,576,415 B2 | 8/2009 | Cha et al. |
| 7,598,163 B2 | 10/2009 | Callahan et al. |
| 7,605,463 B2 | 10/2009 | Sunohara et al. |
| 7,615,856 B2 | 11/2009 | Sakai et al. |
| 7,625,818 B2 | 12/2009 | Wang |
| 7,629,674 B1 | 12/2009 | Foster |
| 7,633,170 B2 | 12/2009 | Yang et al. |
| 7,633,765 B1 | 12/2009 | Scanlan et al. |
| 7,642,132 B2 | 1/2010 | Huang et al. |
| 7,643,311 B2 | 1/2010 | Coffy |
| 7,656,023 B2 | 2/2010 | Sunohara et al. |
| 7,656,047 B2 | 2/2010 | Yang et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,700,411 B2 | 4/2010 | Yang et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,745,910 B1 | 6/2010 | Olson et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,829,981 B2 | 11/2010 | Hsu |
| 7,842,597 B2 | 11/2010 | Tsai |
| 7,851,893 B2 | 12/2010 | Kim et al. |
| 7,872,343 B1 | 1/2011 | Berry |
| 7,944,038 B2 | 5/2011 | Chiu et al. |
| 7,989,928 B2 | 8/2011 | Liao et al. |
| 8,018,033 B2 | 9/2011 | Moriya |
| 8,022,511 B2 | 9/2011 | Chiu et al. |
| 8,030,750 B2 | 10/2011 | Kim et al. |
| 8,058,714 B2 | 11/2011 | Noll et al. |
| 8,061,012 B2 | 11/2011 | Carey et al. |

(56) References Cited

U.S. PATENT DOCUMENTS

| | | | |
|---|---|---|---|
| 8,093,690 | B2 | 1/2012 | Ko et al. |
| 8,110,902 | B2 | 2/2012 | Eun et al. |
| 8,186,048 | B2 | 5/2012 | Leahy et al. |
| 8,212,339 | B2 | 7/2012 | Liao et al. |
| 2002/0017855 | A1 | 2/2002 | Cooper et al. |
| 2002/0094605 | A1 | 7/2002 | Pai et al. |
| 2004/0020673 | A1 | 2/2004 | Mazurkiewicz |
| 2004/0124518 | A1 | 7/2004 | Karnezos |
| 2004/0150097 | A1 | 8/2004 | Gaynes et al. |
| 2004/0160752 | A1* | 8/2004 | Yamashita et al. ............ 361/766 |
| 2004/0178500 | A1 | 9/2004 | Usui |
| 2004/0231872 | A1 | 11/2004 | Arnold et al. |
| 2004/0252475 | A1 | 12/2004 | Tsuneoka et al. |
| 2004/0259292 | A1 | 12/2004 | Beyne et al. |
| 2005/0013082 | A1 | 1/2005 | Kawamoto et al. |
| 2005/0029673 | A1 | 2/2005 | Naka et al. |
| 2005/0039946 | A1 | 2/2005 | Nakao |
| 2005/0045358 | A1 | 3/2005 | Arnold |
| 2005/0189635 | A1 | 9/2005 | Humpston et al. |
| 2005/0208702 | A1 | 9/2005 | Kim |
| 2005/0258545 | A1 | 11/2005 | Kwon |
| 2006/0001174 | A1 | 1/2006 | Matsui et al. |
| 2006/0027632 | A1 | 2/2006 | Akram |
| 2006/0145361 | A1 | 7/2006 | Yang et al. |
| 2006/0197216 | A1 | 9/2006 | Yee |
| 2006/0266547 | A1 | 11/2006 | Koga |
| 2007/0048896 | A1 | 3/2007 | Andry et al. |
| 2007/0138562 | A1 | 6/2007 | Trezza |
| 2007/0187711 | A1 | 8/2007 | Hsiao et al. |
| 2007/0290319 | A1* | 12/2007 | Kim ............................ 257/686 |
| 2008/0042301 | A1 | 2/2008 | Yang et al. |
| 2008/0061407 | A1 | 3/2008 | Yang et al. |
| 2008/0174013 | A1 | 7/2008 | Yang et al. |
| 2008/0272486 | A1 | 11/2008 | Wang et al. |
| 2009/0000114 | A1 | 1/2009 | Rao et al. |
| 2009/0000815 | A1 | 1/2009 | Hiner et al. |
| 2009/0000816 | A1 | 1/2009 | Hiner et al. |
| 2009/0002969 | A1 | 1/2009 | Madsen et al. |
| 2009/0002970 | A1 | 1/2009 | Leahy et al. |
| 2009/0002971 | A1 | 1/2009 | Carey et al. |
| 2009/0002972 | A1 | 1/2009 | Carey et al. |
| 2009/0025211 | A1 | 1/2009 | Hiner et al. |
| 2009/0032928 | A1 | 2/2009 | Chiang et al. |
| 2009/0035895 | A1 | 2/2009 | Lee et al. |
| 2009/0039527 | A1 | 2/2009 | Chan et al. |
| 2009/0102003 | A1 | 4/2009 | Vogt et al. |
| 2009/0102033 | A1 | 4/2009 | Raben |
| 2009/0140436 | A1 | 6/2009 | Wang |
| 2009/0146297 | A1 | 6/2009 | Badakere et al. |
| 2009/0166785 | A1 | 7/2009 | Camacho et al. |
| 2009/0194851 | A1 | 8/2009 | Chiu et al. |
| 2009/0194852 | A1 | 8/2009 | Chiu et al. |
| 2009/0230487 | A1 | 9/2009 | Saitoh et al. |
| 2009/0230523 | A1 | 9/2009 | Chien et al. |
| 2009/0230524 | A1 | 9/2009 | Chien et al. |
| 2009/0230525 | A1 | 9/2009 | Chien et al. |
| 2009/0230526 | A1 | 9/2009 | Chen et al. |
| 2009/0236700 | A1 | 9/2009 | Moriya |
| 2009/0243045 | A1 | 10/2009 | Pagaila et al. |
| 2009/0256244 | A1 | 10/2009 | Liao et al. |
| 2009/0294959 | A1 | 12/2009 | Chiang et al. |
| 2009/0302435 | A1 | 12/2009 | Pagaila et al. |
| 2009/0302437 | A1 | 12/2009 | Kim et al. |
| 2009/0309235 | A1 | 12/2009 | Suthiwongsunthorn et al. |
| 2009/0321916 | A1 | 12/2009 | Wang et al. |
| 2010/0006330 | A1 | 1/2010 | Fu et al. |
| 2010/0013064 | A1 | 1/2010 | Hsu |
| 2010/0032815 | A1 | 2/2010 | An et al. |
| 2010/0059855 | A1 | 3/2010 | Lin et al. |
| 2010/0065948 | A1 | 3/2010 | Bae et al. |
| 2010/0109132 | A1 | 5/2010 | Ko et al. |
| 2010/0110656 | A1 | 5/2010 | Ko et al. |
| 2010/0133704 | A1 | 6/2010 | Marimuthu et al. |
| 2010/0140737 | A1 | 6/2010 | Lin et al. |
| 2010/0140751 | A1 | 6/2010 | Tay et al. |
| 2010/0140752 | A1 | 6/2010 | Marimuthu et al. |
| 2010/0140776 | A1 | 6/2010 | Trezza |
| 2010/0148316 | A1 | 6/2010 | Kim et al. |
| 2010/0187681 | A1 | 7/2010 | Chen et al. |
| 2010/0197134 | A1 | 8/2010 | Trezza |
| 2010/0199492 | A1 | 8/2010 | Hiner et al. |
| 2010/0207257 | A1 | 8/2010 | Lee |
| 2010/0207258 | A1 | 8/2010 | Eun et al. |
| 2010/0207259 | A1 | 8/2010 | Liao et al. |
| 2010/0230759 | A1 | 9/2010 | Yang et al. |
| 2010/0230760 | A1 | 9/2010 | Hung |
| 2010/0230788 | A1 | 9/2010 | Peng |
| 2010/0244244 | A1 | 9/2010 | Yang |
| 2010/0276690 | A1 | 11/2010 | Chen |
| 2010/0327465 | A1 | 12/2010 | Shen et al. |
| 2011/0048788 | A1 | 3/2011 | Wang et al. |
| 2011/0068437 | A1 | 3/2011 | Chiu et al. |
| 2011/0095435 | A1 | 4/2011 | Volant et al. |
| 2011/0115060 | A1 | 5/2011 | Chiu et al. |
| 2011/0139497 | A1 | 6/2011 | Li et al. |
| 2011/0254155 | A1 | 10/2011 | Lin et al. |
| 2012/0062439 | A1 | 3/2012 | Liao et al. |

FOREIGN PATENT DOCUMENTS

| | | |
|---|---|---|
| JP | 2004228135 A | 8/2004 |
| JP | 2008166527 A | 7/2008 |
| TW | 200612539 A | 4/2006 |
| WO | WO2004060034 A | 7/2004 |
| WO | 2010151375 A1 | 12/2010 |

OTHER PUBLICATIONS

TIPO Office Action with translation of search report, dated Feb. 11, 2015, for Taiwan Patent Application No. 102126548.

* cited by examiner

SEMICONDUCTOR PACKAGE HAVING AN ANTENNA AND MANUFACTURING METHOD THEREOF

BACKGROUND OF THE INVENTION

1. Field of the Invention

The invention relates in general to a semiconductor package and a manufacturing method thereof, and more particularly to a semiconductor package with an antenna and a manufacturing method thereof.

2. Description of the Related Art

Wireless communication devices, such as cell phones, require antennas for transmitting and receiving radio frequency (RF) signals. Conventionally, a wireless communication device includes therein an antenna and a communication module (e.g., a semiconductor package with RF communication capability), each disposed on different parts of a circuit board. Under the conventional approach, the antenna and the communication module are separately manufactured and electrically connected after being placed on the circuit board. Accordingly, higher manufacturing costs are incurred and a compact product design as well as reduced device size are difficult to achieve. In addition, a RF signal transmission path between the antenna and the communication module is long, and the quality of a signal transmitted between the antenna and the communication module is reduced.

SUMMARY OF THE INVENTION

One aspect of the disclosure relates to a semiconductor package. In one embodiment, the semiconductor package includes a first substrate including a ground layer; an interposer disposed on an upper surface of the first substrate and having at least one opening; a first die disposed in the at least one opening and coupled to the first substrate; a second substrate coupled to the interposer, disposed over the first substrate and having an area less than an area of the first substrate; a second die disposed on a lower surface of the second substrate; a third die embedded within the second substrate; an inductor disposed on an upper surface of the second substrate wherein the inductor is electrically connected to the second die and the third die; a package body encapsulating portions of the first substrate, the interposer, the second substrate, the first die and the second die, the package body having a lateral surface and an upper surface; and a metal layer disposed on the lateral surface and upper surface of the package body wherein the metal layer is electrically connected to the first substrate and wherein the metal layer has voids that overlie the inductor that determine a radiation distribution pattern. The lateral surface of the package body can be substantially aligned with a lateral surface of the first substrate. In an embodiment, a dielectric layer covers the upper surface of the metal layer; and a patterned metal layer is formed on the dielectric layer. In an embodiment, the embedded third die has an active surface facing towards the first substrate and includes bond pads which are exposed from the second substrate, a conductive path connects the exposed bond pads with the inductor. In this embodiment, the inductor is separated from the metal layer by the package body. In an embodiment, an electrical frame electrically is connected to the ground layer and the metal layer.

Another aspect of the disclosure relates to manufacturing methods. In one embodiment, a manufacturing method is described as follows. The method includes forming a first substrate having a grounding segment. The method includes forming a second substrate, on which a semiconductor chip is disposed. The method includes disposing an interposer substrate between the first substrate and the second substrate, wherein the interposer substrate is electrically connected to the first substrate and the second substrate. A package body encapsulating portions of the second substrate, the semiconductor chip and the interposer substrate is formed. A singulation passing through the package body and the first substrate is formed, such that each of the package body and the first substrate forms a lateral surface. A first antenna layer disposed on the lateral surface and an upper surface of the package body is formed, wherein the first antenna layer is electrically connected to the grounding segment of the first substrate.

Another aspect of the disclosure relates to manufacturing methods. In one embodiment, a manufacturing method is described as follows. The method includes forming a first substrate having a grounding segment. The method includes forming a second substrate, on which a semiconductor chip is disposed. The method includes disposing an interposer substrate between a first substrate and the second substrate, wherein the interposer substrate is electrically connected to the first substrate and the second substrate. A package body encapsulating portions of the second substrate, the semiconductor chip and the interposer substrate is formed. A first singulation passing through the package body is formed, such that the package body forms a lateral surface. A first antenna layer disposed on the lateral surface and an upper surface of the package body is formed, wherein the first antenna layer is electrically connected to the grounding segment of the first substrate. A second singulation passing through the first substrate is then formed.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1A:
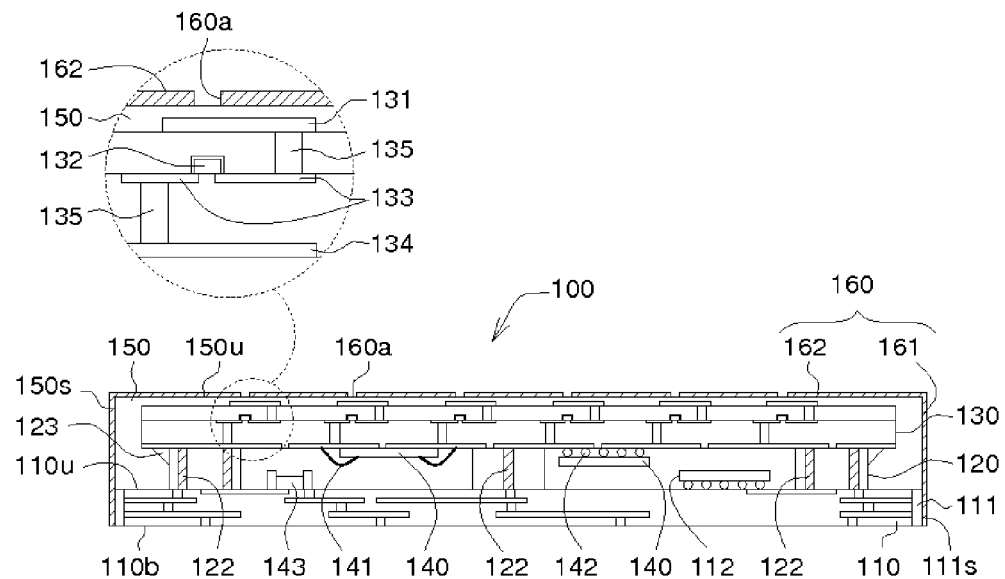
FIG. 1A illustrates a cross-sectional view of a semiconductor package according to one embodiment of the invention.

Referring to FIG. 1A, a cross-sectional view of a semiconductor package 100, according to one embodiment of the invention, is illustrated. The semiconductor package 100 includes a first substrate 110, an interposer substrate 120, a second substrate 130, a plurality of semiconductor chips 140, a package body 150 and a first antenna layer 160.

The first substrate 110 has an upper surface 110u and a lower surface 110b opposite to the upper surface 110u, and includes a grounding segment 111. The first substrate 110 can be a multi-layered organic substrate or a ceramic substrate, for example. In addition, at least a semiconductor chip 112 and a passive component 143 are further disposed on the upper surface 110u of the first substrate 110 and electrically connected to the first substrate 110. For example, the semiconductor chip 112 disposed on the first substrate 110 may include a baseband chip.

In the present embodiment, the grounding segment 111 is a conductive pillar which extends from the upper surface 110u of the first substrate 110 to the lower surface 110b of the first substrate 110 (that is, the grounding segment 111 penetrates the first substrate 110). In another embodiment, the grounding segment 111 may not penetrate the first substrate 110. The grounding segment 111 can be made from a conductive material, including copper.

The interposer substrate 120 is disposed between the first substrate 110 and the second substrate 130 allowing a space in which the passive component 143, the semiconductor chips 140 are accommodated. In addition, the interposer substrate 120 can be placed in such a way to support a periphery portion and a middle portion of the second substrate 130 to reduce any warpage of the second substrate 130.

The interposer substrate 120 includes several conductive components 122 which electrically connect the first substrate 110 and the second substrate 130, such that a signal may be transmitted between the first substrate 110 and the second substrate 130 through the interposer substrate 120. Moreover, an adhesive 123 may be formed in a corner between the second substrate 130 and the interposer substrate 120 lest the interposer substrate 120 drops when the second substrate 130 is inverted.

The second substrate 130 may be a multi-layered organic substrate or a ceramic substrate, for example. The second substrate 130 includes a microstrip line 131, an embedded phase shifter 132, a patterned conductive layer 133, a feeding network 134 and a plurality of vias 135. The microstrip line 131 is disposed on the surface of the second substrate 130 and separated from the first antenna layer 160 by the package body 150. Consequently, an electrical current is generated in the first antenna layer 160 or the microstrip line 131 through electromagnetic induction.

The embedded phase shifter 132 is embedded in the second substrate 130 and electrically connects the microstrip line 131 and the feeding network 134 by the via 135 and the patterned conductive layer 133. In addition, the embedded phase shifter 132 electrically connects the feeding network 134 by the via 135 and the patterned conductive layer 133. The embedded phase shifter 132, such as a diode, can adjust a phase of a radio frequency signal emitted or received by the first antenna layer 160. In another embodiment, the embedded phase shifter 132 can be a power amplifier to modulate amplitude of the radio frequency signal. The feeding network 134 can transmit the signal from the semiconductor chips 140 to the first antenna layer 160.

The semiconductor chips 140 are disposed on the second substrate 130 and located between the first substrate 110 and the second substrate 130. For example, the semiconductor chip 140 disposed on the second substrate 130 may be a high-frequency chip. When one of the semiconductor chips 140 is electrically connected to the second substrate 130 via a plurality of bond wires 141, an active surface of the semiconductor chips 140 faces the first substrate 110. When one of the semiconductor chips 140 is electrically connected to the second substrate 130 via a solder ball 142, an active surface the semiconductor chips 140 faces the second substrate 130.

In the present embodiment, the package body 150 encapsulates the second substrate 130, the semiconductor chip 140 and the interposer substrate 120, and has a lateral surface 150s and an upper surface 150u. The lateral surface 150s of the package body 150 is substantially flush or coplanar with a lateral surface 111s of the grounding segment 111, when the lateral surface 150s of the package body 150 and the lateral surface 111s of grounding segment 111 are formed in the same singulation process.

The package body 150 is made from a material including a dielectric material, such that an electric field can be generated between the first antenna layer 160 and the microstrip line 131. In one embodiment, the package body 150 may include material such as novolac-based resin, epoxy-based resin, silicone-based resin or other suitable encapsulant. The package body 150 may also include suitable fillers such as powdered silicon dioxide. The package body 150 can be formed by various packaging technologies, such as, for example, compression molding, injection molding or transfer molding.

The first antenna layer 160 is formed on the lateral surface 150s and the upper surface 150u of the package body 150, and is extended to the lateral surface 111s of grounding segment 111 to electrically connect the grounding segment 111. The first antenna layer 160 can minimize electromagnetic interference (EMI) radiation from the semiconductor package 100 and prevent RF radiation from external sources from interfering with operation of the semiconductor package 100.

The first antenna layer 160 may include aluminum, copper, chromium, tin, gold, silver, nickel, stainless steel or any other suitable metal or alloy. The first antenna layer 160 may be a single-layered or multi-layered structure. In one embodiment, the first antenna layer 160 is a triple-layered structure, the inner layer is a stainless steel layer, the middle layer is a copper layer, and the outer layer is a stainless steel layer. In another embodiment, the first antenna layer 160 is a double-layered structure, wherein the inner layer is a copper layer, and the outer layer is a stainless steel layer.

The first antenna layer 160 includes a grounding layer 161 and an irradiation layer 162 connected to the grounding layer 161. The grounding layer 161 is formed on the lateral surface 150s of the package body 150 and the lateral surface 111s of the grounding segment 111. The irradiation layer 162 is formed on the upper surface 150u of the package body 150 and has a plurality of slots 160a from which a part of the package body 150 is exposed. When the first antenna layer 160 is driven by a driving frequency, the slots 160a radiate electromagnetic waves. Therefore, the shape and size of the slots 160a, as well as the driving frequency determine the radiation distribution pattern.

As illustrated in FIG. 1A, the radio frequency signal may be transmitted to the semiconductor chip 140 through a transmission path including the slots 160a, the microstrip line 131, the via 135, the patterned conductive layer 133, the embedded phase shifter 132 and the feeding network 134. The RF signal distortion according to the present embodiment is reduced since the transmission path is reduced.

Figure 1B:
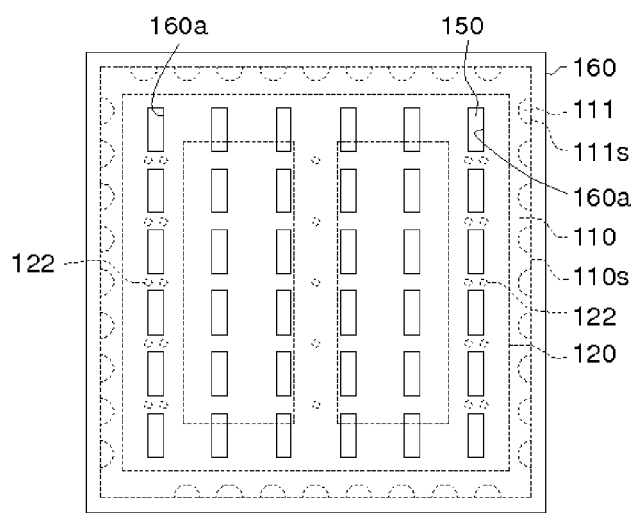
FIG. 1B illustrates a top view of FIG. 1A.

Referring to FIG. 1B, a top view of FIG. 1A is illustrated. In the present embodiment, the slots 160a are arranged in the form of an array. In another embodiment, the slots 160a can be arranged in an arbitrary form and the number of the slots 160a can be single. In practice, the form and the number of the slots 160a depend on the impedance matching for the first antenna layer 160.

As illustrated in FIG. 1B, since the lateral surface 110s of the first substrate 110 and the lateral surface 111s of the grounding segment 111 are formed in the same singulation process, the lateral surface 111s of the first substrate 111 is substantially flush or coplanar with the lateral surface 110s of the first substrate 110. In addition, the interposer substrate 120 is a closed loop-shape substrate. In another embodiment, the interposer substrate 120 is an open loop-shape substrate.

Figure 2:
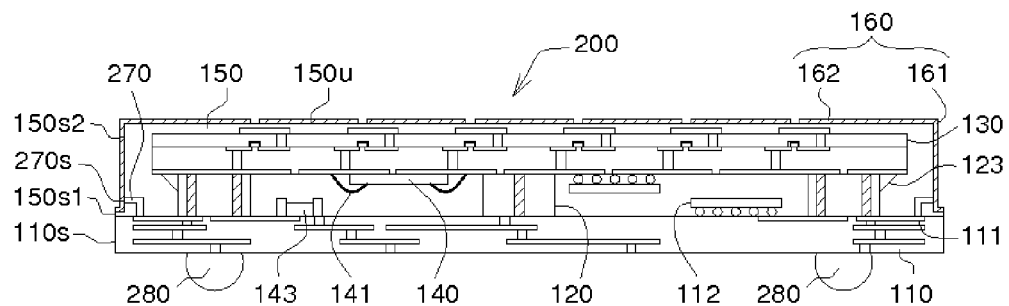
FIG. 2 illustrates a cross-sectional view of a semiconductor package according to another embodiment of the invention.

Referring to FIG. 2, a cross-sectional view of a semiconductor package 200, according to another embodiment of the invention is illustrated. The semiconductor package 200 includes a first substrate 110, an interposer substrate 120, a second substrate 130, a plurality of semiconductor chip 140, a package body 150, a first antenna layer 160, an electrical frame 270 and a plurality of contacts 280.

The first substrate 110 includes a grounding segment 111 such as a patterned conductive layer, wherein the grounding segment 111 is electrically connected to the corresponding electrical contact 280. In another embodiment, the grounding segment 111 can be achieved by a trace, a solder or a conductive pillar. In the present embodiment, the grounding segment 111 is not exposed from a lateral surface 110s of the first substrate 110, but such embodiment is not meant to be limiting. The lateral surface 110s of the first substrate 110 is substantially flush or coplanar with a first lateral surface 150s1 of the package body 150 due to the first lateral surface 150s1 of the package body 150 and the lateral surface 110s of the first substrate 110 being formed in the same singulation process.

In the present embodiment, the package body 150 encapsulates the second substrate 130, the semiconductor chips 140 and the interposer substrate 120. The package body 150 has a second lateral surface 150s2 and an upper surface 150u, wherein the second lateral surface 150s2 of the package body 150 is substantially flush or coplanar with the a lateral surface 270s of the electrical frame 270 due to the second lateral surface 150s2 of the package body 150 and the lateral surface 270s of the electrical frame 270 being formed in the same singulation process.

The electrical frame 270 is electrically connected to the grounding segment 111, and is exposed form the first lateral surface 150s1 of the package body 150, such that the first antenna layer 160 can be formed on the exposed electrical frame 270 and electrically connects to the grounding segment 111 through the electrical frame 270.

Figure 3A:
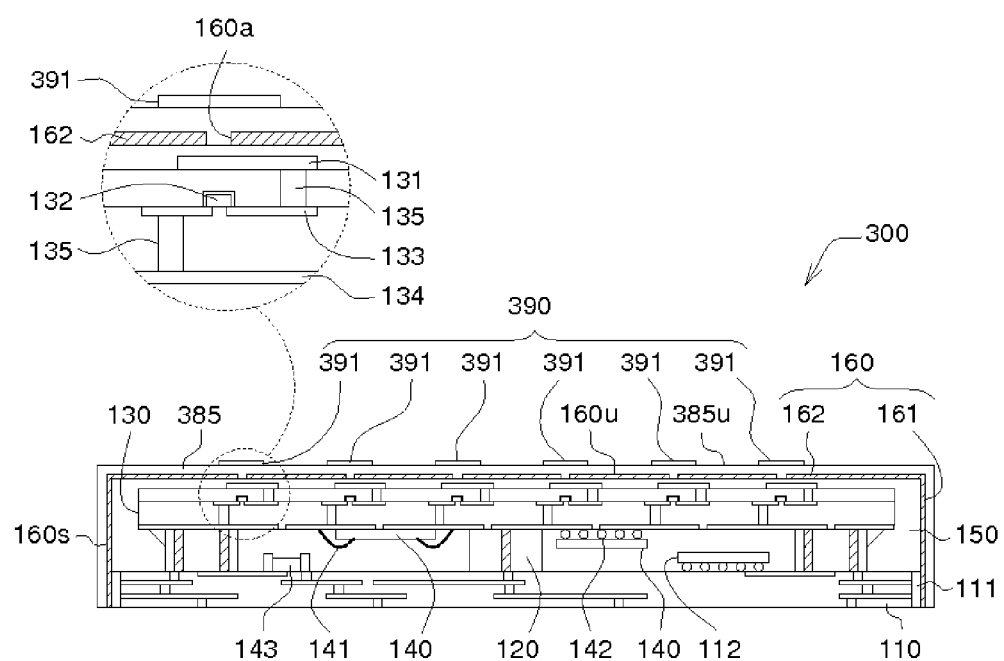
FIG. 3A illustrates a cross-sectional view of a semiconductor package according to another embodiment of the invention.

Referring to FIG. 3A, a cross-sectional view of a semiconductor package 300, according to another embodiment of the invention is illustrated. The semiconductor package 300 includes a first substrate 110, an interposer substrate 120, a second substrate 130, a plurality of semiconductor chips 140, a package body 150, a first antenna layer 160, a dielectric layer 385 and a second antenna layer 390.

The dielectric layer 385 covers an upper surface 160u and a lateral surface 160s of the first antenna layer 160; that is, the dielectric layer 385 covers the grounding layer 161 and the irradiation layer 162 of the first antenna layer 160. The dielectric layer 385 can be formed by a material such as a package body, a dielectric material (e.g., epoxy), or a prepreg lamination.

The second antenna layer 390 is formed on an upper surface 385u of the dielectric layer 385, and separated from the first antenna layer 160, that is, the second antenna layer 390 is not electrically connected to the grounding segment 111. In the present embodiment, the second antenna layer 390 is an aperture coupled antenna. The region of the second antenna layer 390 corresponds to the slots 160a of first antenna layer 160 to shorten a transmission path for signal between the second antenna layer 390 and the first antenna layer 160.

Figure 3B:
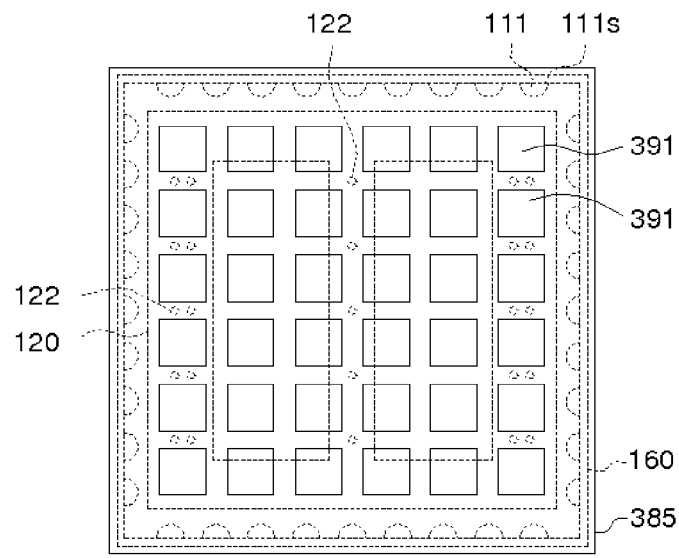
FIG. 3B illustrates a top view of FIG. 3A.

Referring FIG. 3B, a top view of FIG. 3A is illustrated. The second antenna layer 390 includes several sub-antennas 391. In the present embodiment, the sub-antennas 391 are separated from each other and arranged in the form of an array so as to increase antenna gain and widen frequency band. In other embodiments, the sub-antennas 391 can be arranged in a different manner depending on design requirements.

Figure 4:
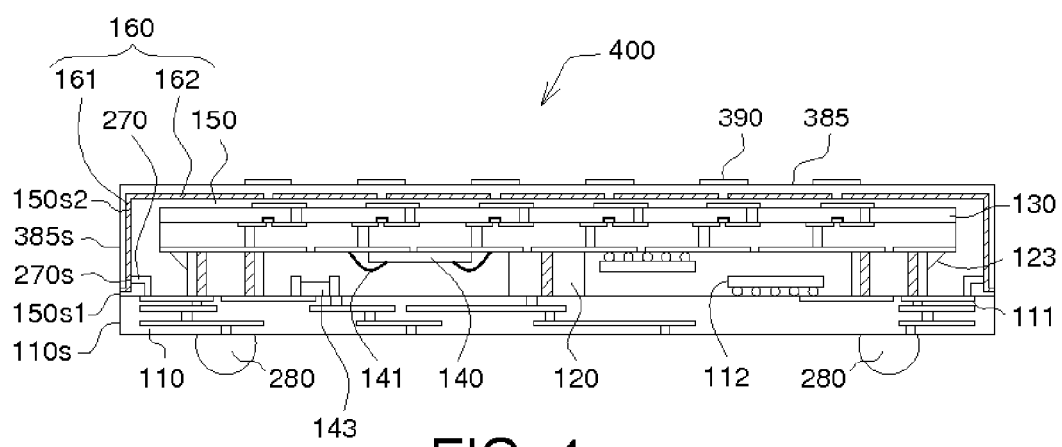
FIG. 4 illustrates a cross-sectional view of a semiconductor package according to another embodiment of the invention.

Referring to FIG. 4, a cross-sectional view of a semiconductor package 400, according to another embodiment of the invention, is illustrated. The semiconductor package 400 includes a first substrate 110, an interposer substrate 120, a second substrate 130, a plurality of semiconductor chips 140, a package body 150, a first antenna layer 160, an electrical frame 270, a plurality of electrical contacts 280, a dielectric layer 385, and a second antenna layer 390.

The first substrate 110 includes a grounding segment 111 such as a patterned conductive layer, wherein the grounding segment 111 is electrically connected the corresponding electrical contact 280. In another embodiment, the grounding segment 111 can be achieved by a trace, a solder or a conductive pillar. In the present embodiment, the grounding segment 111 is not exposed from a lateral surface 110s of the first substrate 110, and such embodiment is not meant to be limiting.

The lateral surface 110s of the first substrate 110 is substantially flush or coplanar with a first lateral surface 150s1 of the package body 150 due to the lateral surface 110s of the first substrate 110 and the first lateral surface 150s1 of the package body 150 being formed in the same singulation process.

The package body 150 encapsulates the second substrate 130, the semiconductor chips 140 and the interposer substrate 120, and has a second lateral surface 150s2 and an upper surface 150u. The second lateral surface 150s2 of the package body 150 is substantially flush or coplanar with a lateral surface 270s of the electrical frame 270 due to the second lateral surface 150s2 of the package body 150 and the lateral surface 270s of the electrical frame 270 being formed in the same singulation process.

The first antenna layer 160 is formed on the second lateral surface 150s2, the upper surface 150u of the package body 150 and the exposed electrical frame 270. The first antenna layer 160 is electrically connected to the grounding segment 111 through the electrical frame 270 and provides EMI protection.

The electrical frame 270 is electrically connected to the grounding segment 111, and is exposed form the second lateral surface 150s2 of the package body 150, such that the first antenna layer 160 can be formed on the exposed electrical frame 270 and electrically connected to the grounding segment 111 through the electrical frame 270.

The dielectric layer 385 covers the grounding layer 161 and the irradiation layer 162 of the first antenna layer 160. The second antenna layer 390 is disposed on the dielectric layer 385.

Figure 5:
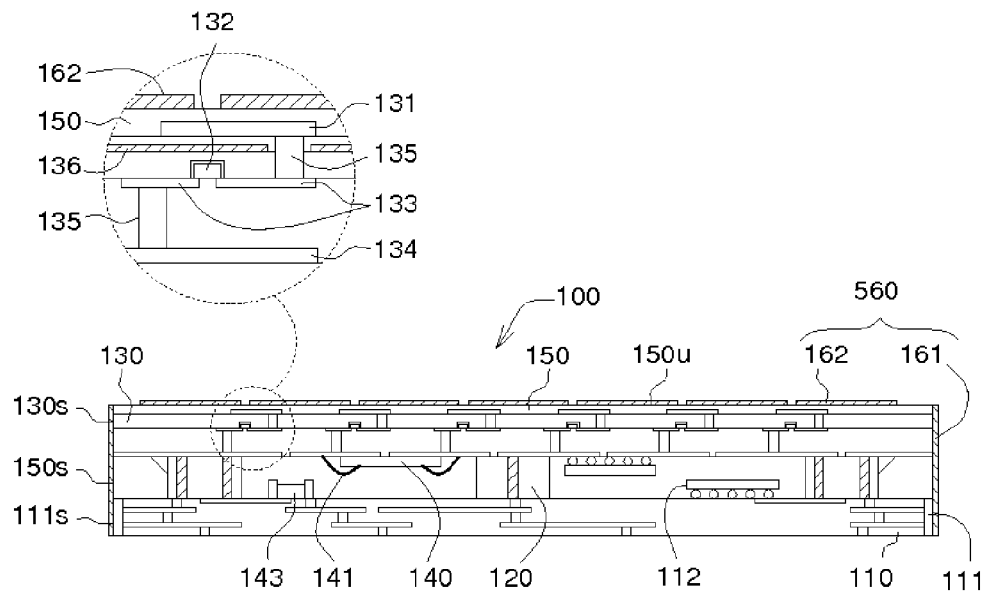
FIG. 5 illustrates a cross-sectional view of a semiconductor package according to another embodiment of the invention.

Referring to FIG. 5, a cross-sectional view of a semiconductor package 500, according to another embodiment of the invention, is illustrated. The semiconductor package 500 includes a first substrate 110, an interposer substrate 120, a second substrate 130, a plurality of semiconductor chip 140, a package body 150 and a first antenna layer 560.

The second substrate 130 has a lateral surface 130s which is substantially flush or coplanar with a lateral surface 150s of the package body 150. The second substrate 130 includes a microstrip line 131, an embedded phase shifter 132, a patterned conductive layer 133, a feeding network 134, a plurality of via 135 and a shielding layer 136. The patterned conductive layer 133 receives a high-frequency signal transmitted by the semiconductor chip 140 through the feeding network 134 and via 135, and then transforms the high-frequency signal into a base frequency signal. The base frequency signal is transmitted to the microstrip line 131 through the via 135, so that the irradiation layer 162 radiates a wireless signal by electromagnetic induction. In addition, the embedded phase shifter 132 can change a radiation power pattern of the wireless signal.

The shielding layer 136 is exposed from a lateral surface 130s of the second substrate 130 to be connected to the grounding layer 161. The combination of the second substrate 130 and the grounding layer 161 serves as an electromagnetic interference shield to protect the semiconductor chips 140 from EMI negatively affecting the operation of the semiconductor chips 140.

The lateral surface 130s of the second substrate 130, a lateral surface 150s of the package body 150 and a lateral surface 111s of the grounding segment 111 are substantially flush or coplanar with each other due to the lateral surface 130s, the lateral surface 150s and the lateral surface 111s being formed in the same singulation process.

The first antenna layer 560 includes a grounding layer 161 and an irradiation layer 162 separated from the grounding segment 161. The grounding layer 161 is formed on the lateral surface 150s of the package body 150 and the exposed grounding segment 111, and the irradiation layer 162 is formed on the upper surface 150u of the package body 150.

Figure 6:
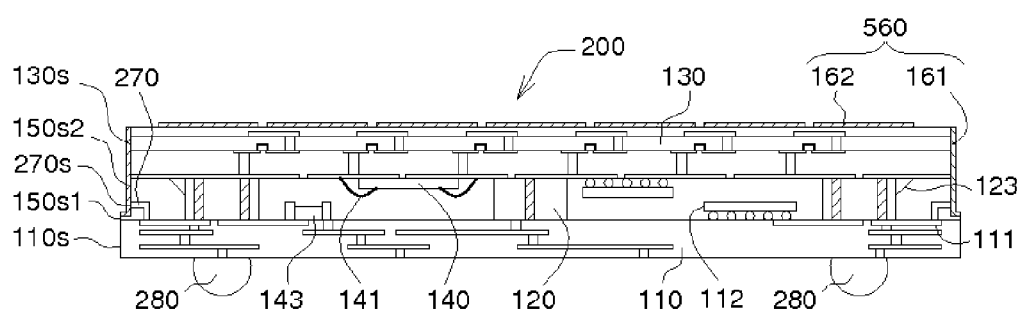
FIG. 6 illustrates a cross-sectional view of a semiconductor package according to another embodiment of the invention.

Referring to FIG. 6, a cross-sectional view of a semiconductor package 600, according to another embodiment of the invention, is illustrated. The semiconductor package 600 includes a first substrate 110, an interposer substrate 120, a second substrate 130, a plurality of semiconductor chip 140, a package body 150, a first antenna layer 160, an electrical frame 270 and a plurality of electrical contacts 280.

The first substrate 110 includes a grounding segment 111 such as a patterned conductive layer, wherein the grounding segment 111 is electrically connected the corresponding electrical contact 280. In the present embodiment, the grounding segment 111 is not exposed from a lateral surface 110s of the first substrate 110, but such embodiment is not meant to be limiting.

The lateral surface 110s of the first substrate 110 is substantially flush or coplanar with a first lateral surface 150s1 of the package body 150 due to the first lateral surface 150s1 of the package body 150 and the lateral surface 110s of the first substrate 110 being formed in the same singulation process.

The package body 150 encapsulates the second substrate 130, the semiconductor chips 140 and the interposer substrate 120, and has a second lateral surface 150s2 and an upper surface 150u, wherein the second lateral surface 150s2 of the package body 150 is substantially flush or coplanar with the a lateral surface 270s of the electrical frame 270 due to the second lateral surface 150s2 of the package body 150 and the lateral surface 270s of the electrical frame 270 being formed in the same singulation process.

The first antenna layer 560 includes a grounding layer 161 and an irradiation layer 162 separated from the grounding segment 161, wherein the grounding layer 161 is formed on the second lateral surface 150s2 of the package body 150 and the exposed grounding segment 111, and the irradiation layer 162 is formed on the upper surface 150u of the package body 150. In the present embodiment, the irradiation layer 162 is an aperture coupled antenna.

Figure 7:
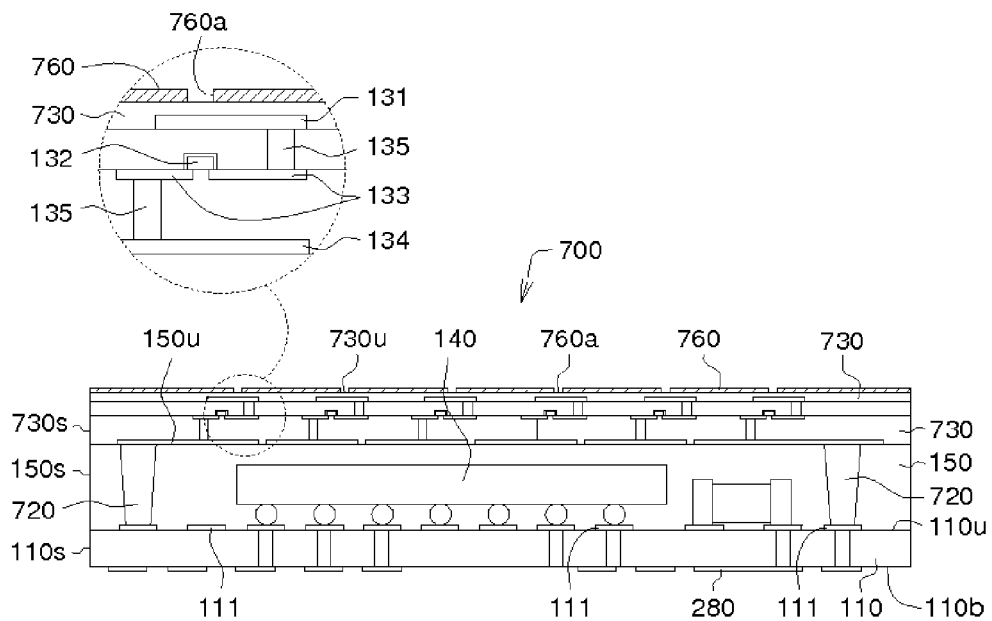
FIG. 7 illustrates a cross-sectional view of a semiconductor package according to another embodiment of the invention.

Referring to FIG. 7, a cross-sectional view of a semiconductor package 700, according to another embodiment of the invention, is illustrated. The semiconductor package 700 includes a first substrate 110, at least a through mold via 720 (TMV), a plurality of dielectric layers 730, a plurality of semiconductor chips 140, a package body 150 and a first antenna layer 760.

As illustrated in FIG. 7, the first substrate 110 includes a lateral surface 110s and a grounding segment 111 such as a patterned conductive layer, wherein the grounding segment 111 is electrically connected to the corresponding electrical contact 280. In the present embodiment, the grounding segment 111 is disposed on an upper surface 110u of the first substrate 110, but such embodiment is not meant to be limiting.

The package body 150 encapsulates the first substrate 110 as well as the semiconductor chips 140, and has a lateral surface 150s and an upper surface 150u, wherein the lateral surface 150s of the package body 150 is substantially flush or coplanar with the lateral surface 110s of the first substrate 110. The through mold via 720 formed in the package body 150 and filled with conductive material is electrically connected to the grounding segment 111.

The dielectric layers 730 are formed on the upper surface 150u of the package body 150. In another embodiment, the dielectric layers 730 may be formed on the upper surface 150u of the package body 150, a lateral surface 730s of the dielectric layers 730, a lateral surface 150s of the package body 150 and a lateral surface 150s of the substrate 110. The microstrip line 131, the embedded phase shifter 132, the patterned conductive layer 133, the feeding network 134 and the via 135 are formed in the dielectric layers 730. In another embodiment, the passive component, including a resistor, a capacitor or an inductor, is formed in the dielectric layers 730. In addition, the dielectric layers 730 can be formed by a material such as a package body, a dielectric material (e.g., epoxy), or a prepreg lamination.

The first antenna layer 760 having a plurality of slot 760a is formed on the upper surface 730u of the dielectric layers 730 and electrically connected to the grounding segment 111 through the through mold via 720 and via 135 (not illustrated). In addition, the material of first antenna layer 760 is similar to that of the first antenna layer 160, and the similarities are not repeated here for the sake of brevity.

As illustrated in FIG. 7, the radio frequency signal may be transmitted to the semiconductor chip 140 through a transmission path including the slots 760a, the microstrip line 131, the via 135, the patterned conductive layer 133, the embedded phase shifter 132, the feeding network 134 and the through mold via 720. The RF signal distortion according to the present embodiment is reduced since the transmission path is reduced.

Referring to FIGS. 8A-8H, embodiment of manufacturing processes according to the semiconductor package of FIG. 1A are illustrated.

Figure 8A:
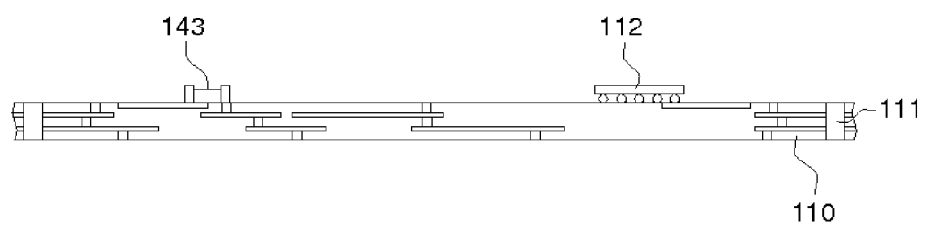
FIGS. 8A-8H illustrate embodiment of manufacturing processes according to the semiconductor package of FIG. 1A.

Referring to FIG. 8A, the first substrate 110 including a plurality of grounding segments 111, such as a conductive pillar, is provided. At least the semiconductor chip 112 and the passive component 143 are disposed on and electrically connected to the first substrate 110. The first substrate 110 is a strip having numerous package sites.

Figure 8B:
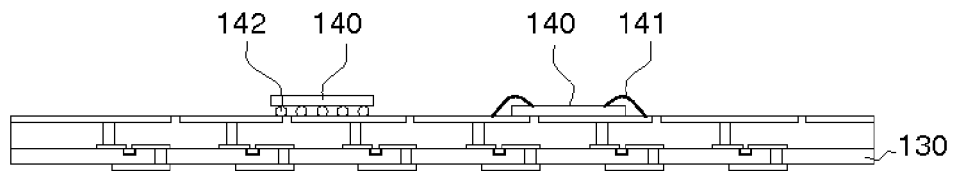

Referring to FIG. 8B, the second substrate 130 is provided, wherein several of the semiconductor chips 140 are disposed on the second substrate 130. One of the semiconductor chips 140 may be disposed on the second substrate 130 in a "face-up" orientation, and electrically connected to the second substrate 130 via a plurality of conductive bond wires 141. Another of the semiconductor chips 140 may be disposed on the second substrate 130 in a "face-down" orientation, and electrically connected to the second substrate 130 via a plurality of solder balls 142.

Figure 8C:
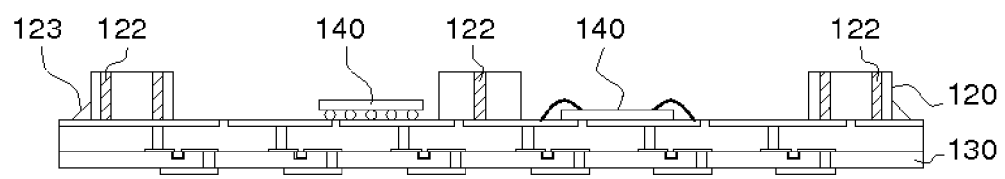

Referring to FIG. 8C, the interposer substrate 120 is disposed on the first substrate 110, wherein the interposer substrate 120 includes a plurality of conductive components 122 for electrically connecting the first substrate 110 and the second substrate 130. That is, the conductive components 122 are electrically connected to contact pads of the first substrate 110 and the second substrate 130 through such as solder material or conductive adhesive. In addition, the adhesive 123 may be formed in a corner of the interposer substrate 120 to further enhance bonding between the interposer substrate 120 and the semiconductor chip 140.

Figure 8D:
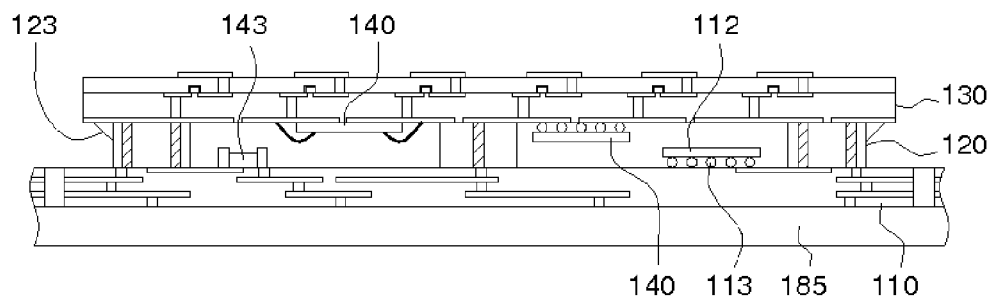

Referring to FIG. 8D, the second substrate 130 is inverted and then disposed on the interposer substrate 120, such that the interposer substrate 120 is located between the first substrate 110 and the second substrate 130. Consequently, the first substrate 110 is electrically connected to the second substrate 130 through the interposer substrate 120. In addition, the first substrate 110 can be adhered onto a carrier 185 before the interposer substrate 120 is disposed on the first substrate 110. After the second substrate 130 is inverted, the solder balls 113 of the semiconductor chip 112 can adhesively connect the first substrate 110 and the semiconductor chip 112 by performing a reflow process.

Figure 8E:
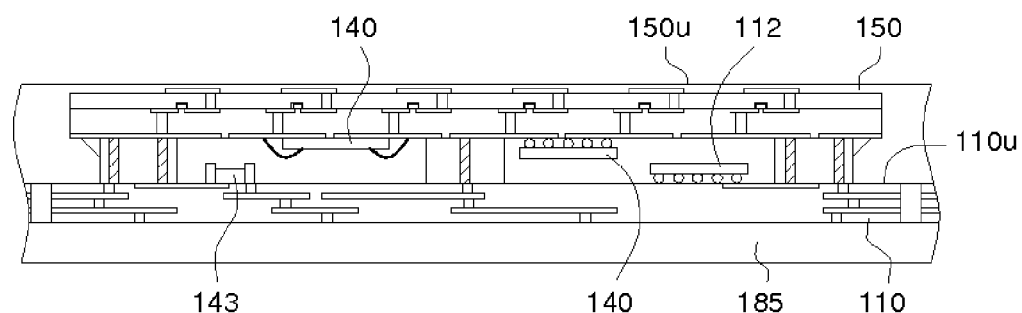

Referring to FIG. 8E, the package body 150 encapsulating the second substrate 130, the semiconductor chips 112, 140 and the interposer substrate 120 is formed on the upper surface 110u of the first substrate 110, wherein the package body 150 has an upper surface 150u.

Figure 8F:
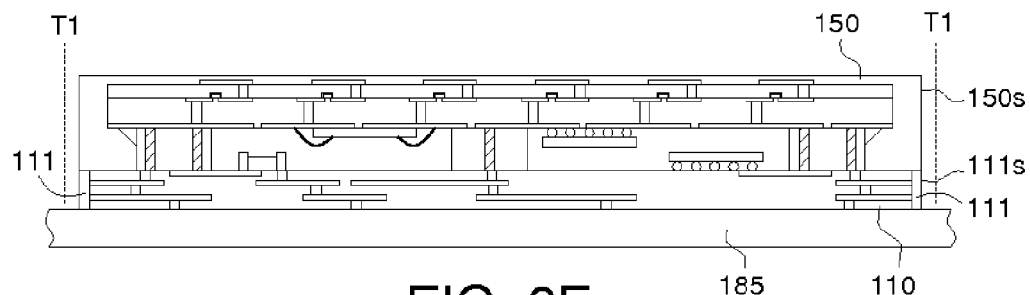

Referring to FIG. 8F, a number of singulation paths T1 passing through the package body 150 and the grounding segment 111 are formed. The singulation paths T1 are formed using a laser or another cutting tool. The lateral surfaces 150s of the package body 150 and the lateral surface 111s of the grounding segment 111 are formed. In the present embodiment of the invention, the singulation method is referred as "full-cut method", that is, the singulation paths T1 cut off the first substrate 110, the grounding segment 111 and the package body 150.

Figure 8G:
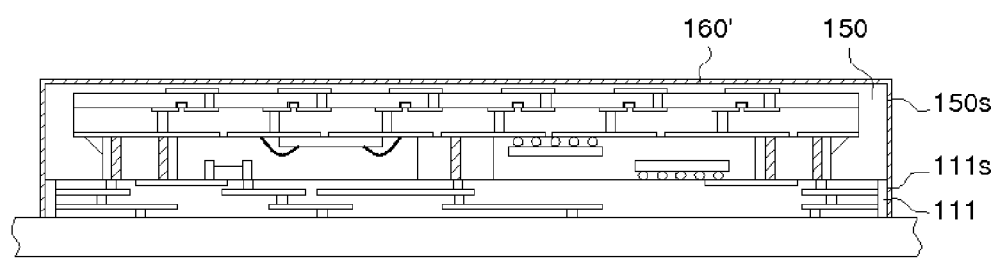

Referring to FIG. 8G, an antenna material 160' is formed on the lateral surface 150s and the upper surface 150u of the package body 150 and the lateral surface 111s of the grounding segment 111. In addition, the antenna material 160' is a metal layer and realized by material formation technology such as chemical vapor deposition, electroless plating, electrolytic plating, printing, spinning, spraying, sputtering, or vacuum deposition.

Figure 8H:
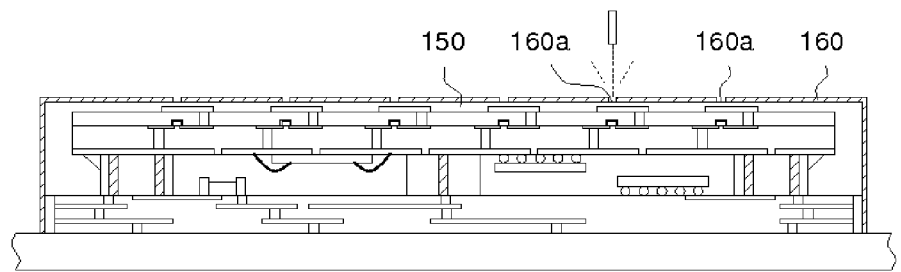

Referring to FIG. 8H, the first antenna layer 160 is formed by forming a plurality of slots 160a in the antenna material 160' (illustrated in FIG. 8G) using patterning technology. The patterning technology for forming the slots 160a can include photolithography, chemical etching, laser drilling, or mechanical drilling. Consequently, a part of the package body 150 is exposed from slots 160a.

Referring to FIGS. 9A-9I, embodiments of manufacturing processes according to the semiconductor package of FIG. 2 are illustrated.

Figure 9A:
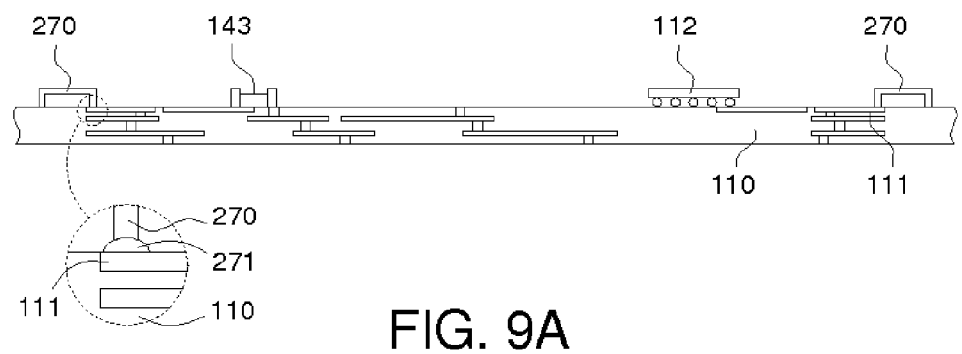
FIGS. 9A-9I illustrate embodiments of manufacturing processes according to the semiconductor package of FIG. 2.

Referring to FIG. 9A, the first substrate 110 including the grounding segment 111, such as a patterned conductive layer, is provided. The semiconductor chip 112 and the passive component 143 are disposed on the first substrate 110. The first substrate 110 is a strip substrate, for example. In addition, the plurality of electrical frames 270 are disposed on the first substrate 110 and electrically connected to the grounding segment 111 through a solder 271.

Figure 9B:
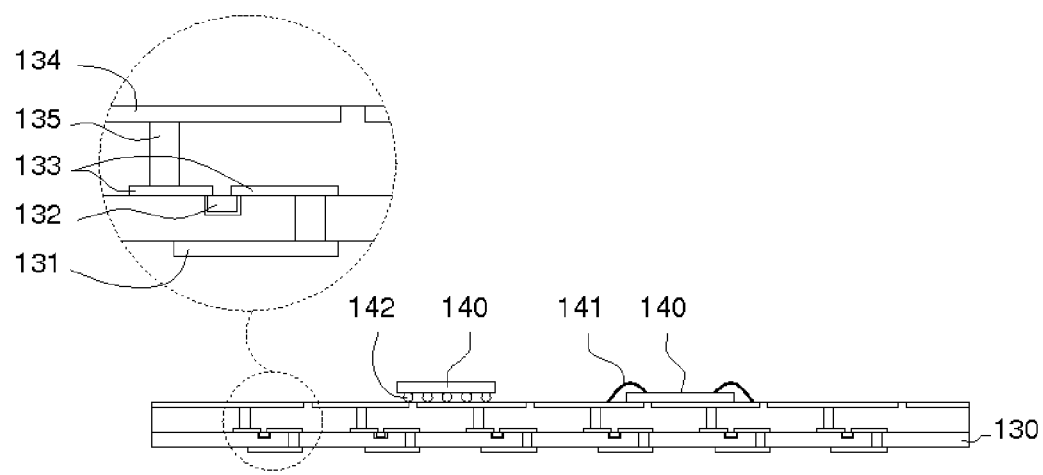

Referring to FIG. 9B, the second substrate 130 is provided, wherein the microstrip line 131, the embedded phase shifter 132, the patterned conductive layer 133, the feeding network 134 and the plurality of vias 135 are formed in the second substrate 130. In addition, the plurality of semiconductor chips 140 are disposed on, and electrically connected to, the second substrate 130. One of the semiconductor chips 140 may be disposed on the second substrate 130 in a "face-up" orientation, and electrically connected to the second substrate 130 via a plurality of conductive bond wires 141. Another of the semiconductor chips 140 may be disposed on the second substrate 130 in a "face-down" orientation, and electrically connected to the second substrate 130 via a plurality of solder balls 142.

Figure 9C:
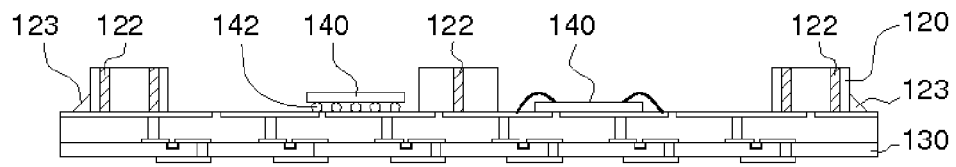

Referring to FIG. 9C, the interposer substrate 120 is disposed on the first substrate 110, wherein the interposer substrate 120 includes the plurality of conductive components 122 for electrically connecting the first substrate 110 and the second substrate 130. The deposition of the adhesive 123 is as the above description. After the adhesive 123 is formed, the solder ball 142 can adhesively connect the interposer substrate 120 and the semiconductor chip 140 by performing a reflow process.

Figure 9D:
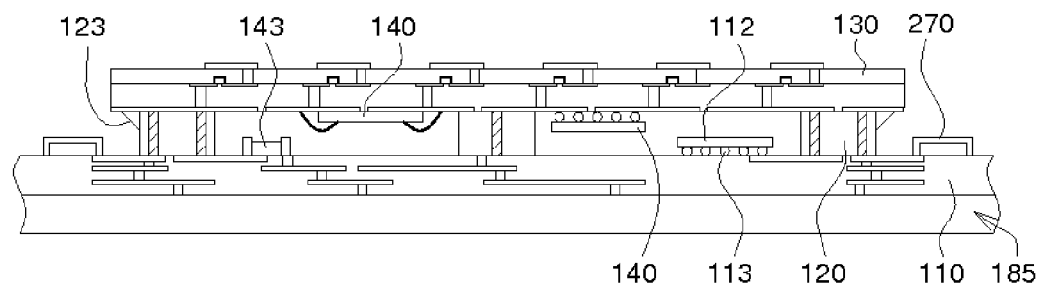

Referring to FIG. 9D, the second substrate 130 is inverted and disposed on the interposer substrate 120, such that the interposer substrate 120 is located between the first substrate 110 and the second substrate 130. In addition, the first substrate 110 can be adhered onto a carrier 185 before the interposer substrate 120 is disposed on the first substrate 110.

Figure 9E:
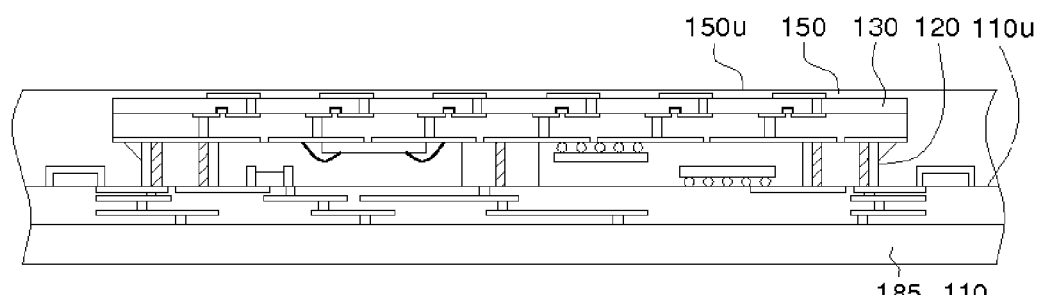

Referring to FIG. 9E, the package body 150 encapsulating the second substrate 130, the semiconductor chips 112, 140 and the interposer substrate 120 is formed on the upper surface 110u of the first substrate 110, wherein the package body 150 has an upper surface 150u.

Figure 9F:
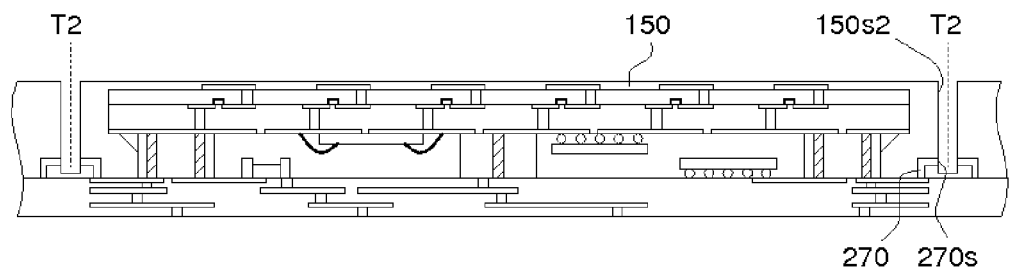

Referring to FIG. 9F, a number of first singulation paths T2 passing through the package body 150 and the electrical frame 270 are formed. The first singulation paths T2 are formed using a laser or another cutting tool, and a second lateral surface 150s2 of the package body 150 and a lateral surface 270s of the electrical frame 270 are thereupon formed. In the present embodiment of the invention, the singulation method is referred to as "half-cut method", that is, the first singulation paths T2 do not cut off the first substrate 110.

Figure 9G:
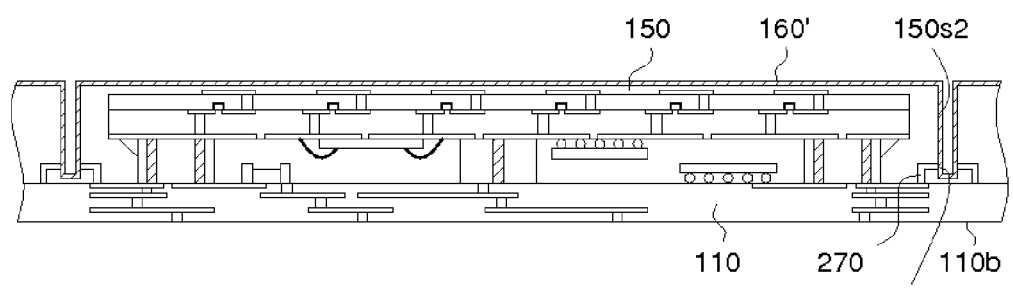

Referring to FIG. 9G, the antenna material 160' is formed on the second lateral surface 150s2 and the upper surface 150u of the package body 150 and the lateral surface 270s of the electrical frame 270. In addition, the antenna material 160' is a metal layer including such as aluminum, stainless, or copper and formed by patterned foil, plating, sputtering or other coating processes.

Figure 9H:
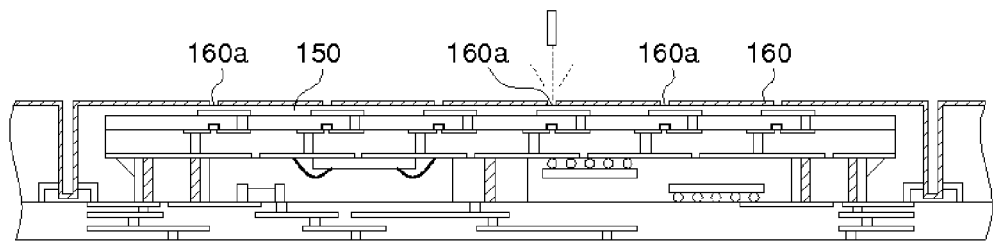

Referring to FIG. 9H, the first antenna layer 160 is formed by forming a plurality of slots 160a in the antenna material 160' using patterning technology, wherein a part of the package body 150 is exposed from slots 160a. The patterning technology for forming the slots 160a can include photolithography, chemical etching, laser drilling, or mechanical drilling.

Figure 9I:
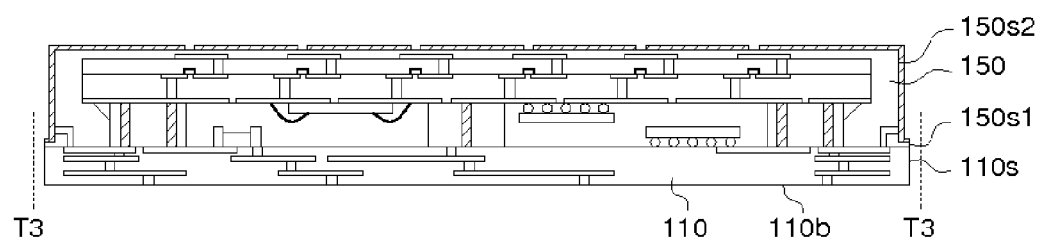

Referring to FIG. 9I, a number of second singulation paths T3 passing through the first substrate 110 are formed. The second singulation paths T3 are formed by using a laser or another cutting tool, and a lateral surface 110s of the first substrate 110 and a first lateral surface 150s1 of the package body 150 are thereupon formed. In addition, before or after the second singulation paths T3 are formed, an electrical contact 280 may be formed adjacent to the lower surface 110b of the first substrate 110 so as to form the semiconductor package 200 illustrated in FIG. 2.

Figure 10A:
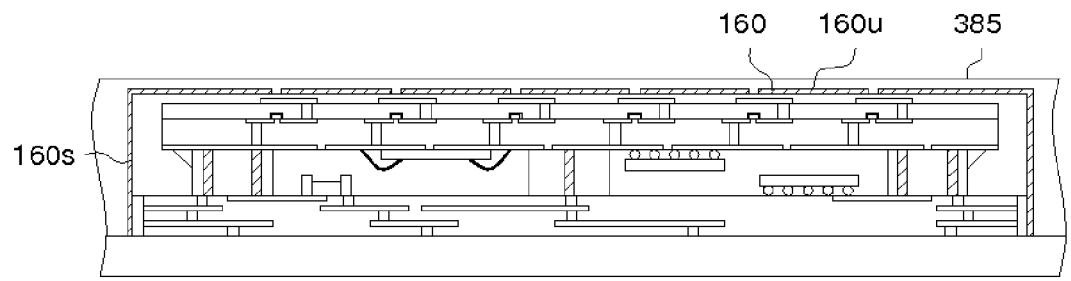
FIGS. 10A-10C illustrate manufacturing processes according to the semiconductor package of FIG. 3A.
Figure 10B:
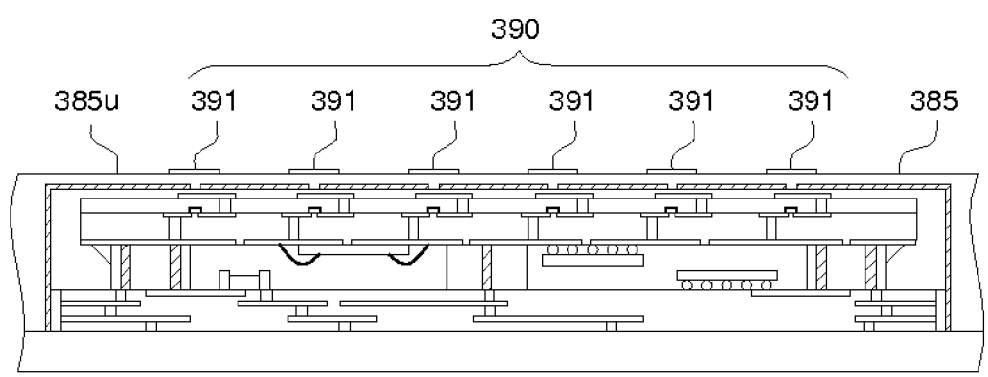
Figure 10C:
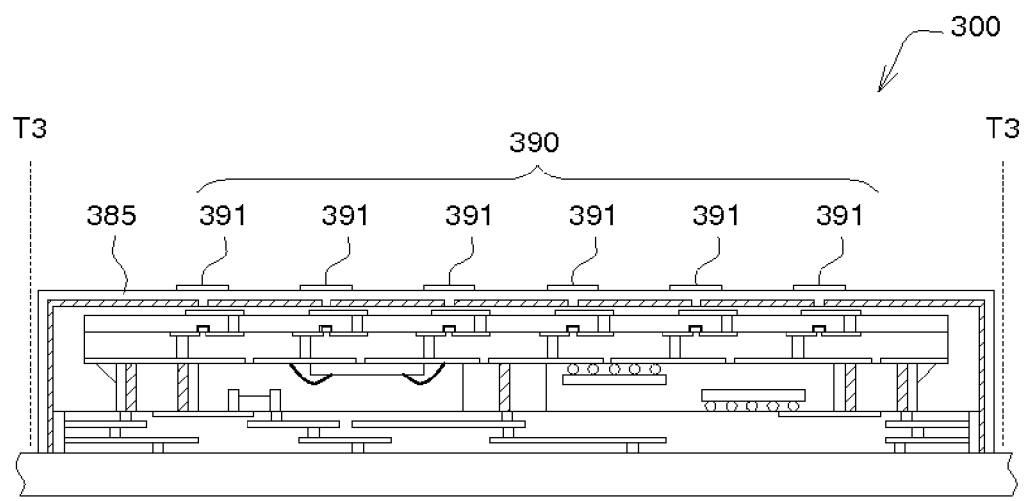

Referring to FIGS. 10A-10C, manufacturing processes according to the semiconductor package of FIG. 3A are illustrated.

Referring to FIG. 10A, the dielectric layer 385 covering the upper surface 160u and the lateral surface 160s of the first antenna layer 160 is formed. The dielectric layer 385 may be formed by using any known packaging technology or laminate technology.

Referring to FIG. 10B, the second antenna layer 390 including the plurality of sub-antennas 391 is formed on the upper surface 385u of the dielectric layer 385. The method of forming the second antenna layer 390 is similar to that of forming the first antenna layer 160 of FIG. 3A, and the similarities are not repeated here for the sake of brevity.

Referring to FIG. 10C, a number of singulation paths passing through the dielectric layer 385 are formed so as to form the semiconductor package 300 illustrated in FIG. 3A.

Referring to FIGS. 11A-11F, manufacturing processes according to the semiconductor package of FIG. 4 are illustrated.

Figure 11A:
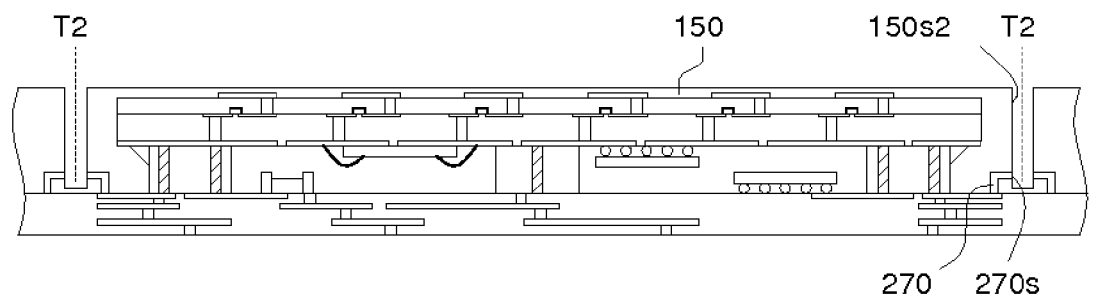
FIGS. 11A-11F illustrate manufacturing processes according to the semiconductor package of FIG. 4.

Referring to FIG. 11A, a number of first singulation paths T2 passing through the package body 150 and the electrical frame 270 are formed. The first singulation paths T2 are formed using a laser or another cutting tool, and the second lateral surface 150s2 of the package body 150 and the lateral surface 270s of the electrical frame 270 are formed. In the present embodiment of the invention, the singulation method is referred to as "half-cut method", that is, the first singulation paths T2 do not cut off the first substrate 110.

Figure 11B:
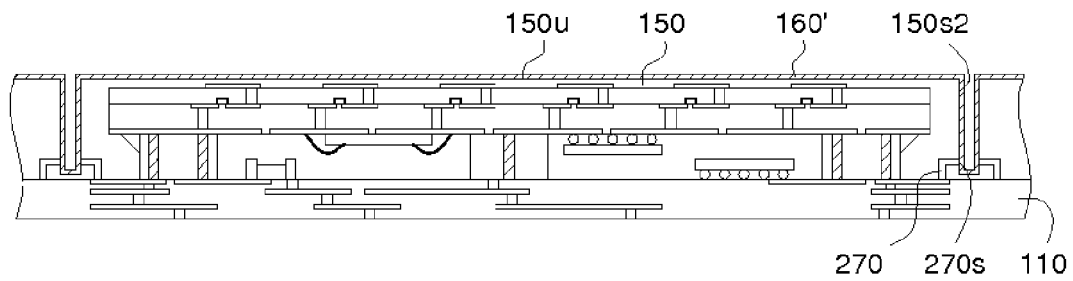

Referring to FIG. 11B, an antenna material 160' is formed on the second lateral surface 150s2 and the upper surface 150u of the package body 150 and the lateral surface 270s of the electrical frame 270. In addition, the antenna material 160' is a metal layer including such as aluminum, stainless, or copper and formed by patterned foil, plating, sputtering or other similar processes.

Figure 11C:
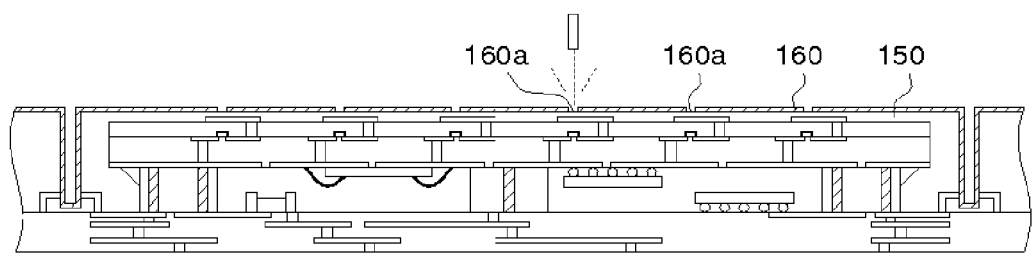

Referring to FIG. 11C, the first antenna layer 160 is formed by forming a plurality of slots 160a in the antenna material 160' (illustrated in FIG. 11B) using patterning technology, wherein a part of the package body 150 is exposed from slots 160a. The patterning technology for forming the slots 160a can include photolithography, chemical etching, laser drilling, or mechanical drilling.

Figure 11D:
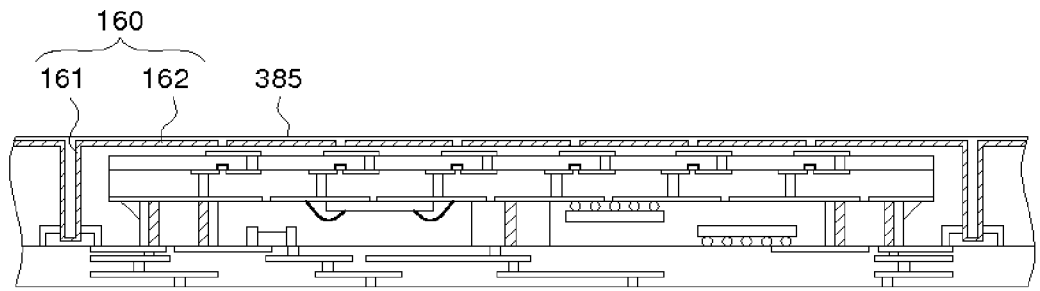

Referring to FIG. 11D, the dielectric layer 385 covering the grounding layer 161 and the irradiation layer 162 of the first antenna layer 160 is formed. The dielectric layer 385 may be formed using any known packaging technology or laminate technology.

Figure 11E:
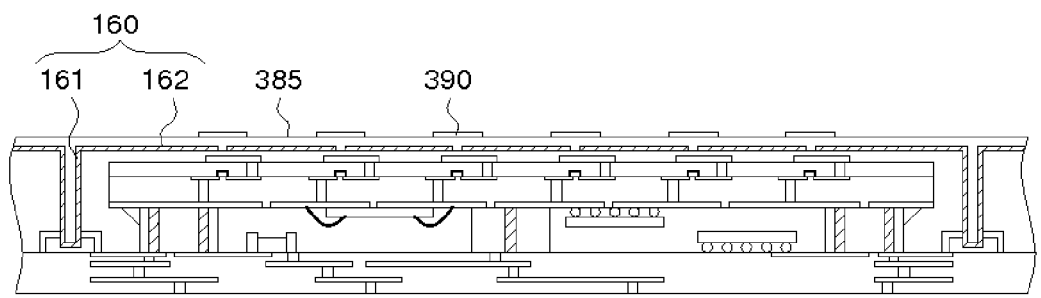

Referring to FIG. 11E, the second antenna layer 390 separated from the first antenna layer 160 is formed on the dielectric layer 385. In the present embodiment, the second antenna layer 390 is an aperture coupled antenna.

Figure 11F:
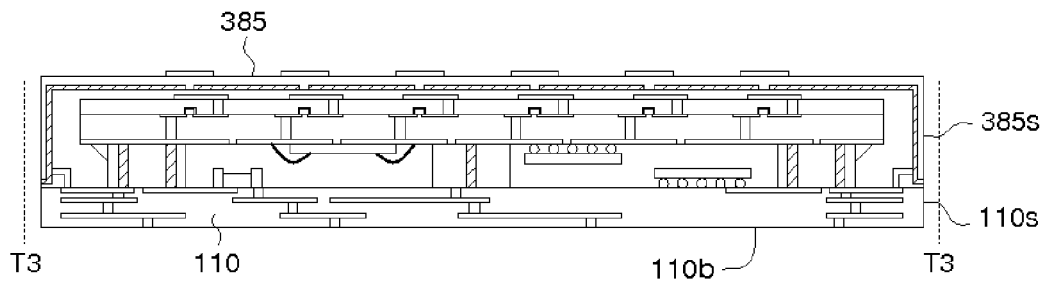

Referring to FIG. 11F, a number of second singulation paths T3 passing through the first substrate 110 and the dielectric layer 385 are formed. The second singulation paths T3 are formed using a laser or another cutting tool, and the lateral surfaces 110s and 385s are thereupon formed on the first substrate 110 and the dielectric layer 385, respectively. In addition, before or after the second singulation paths T3 are formed, the electrical contact 280 (illustrated in FIG. 4) may be formed adjacent to the lower surface 110b of the first substrate 110 so as to form the semiconductor package 400 illustrated in FIG. 4.

Figure 12A:
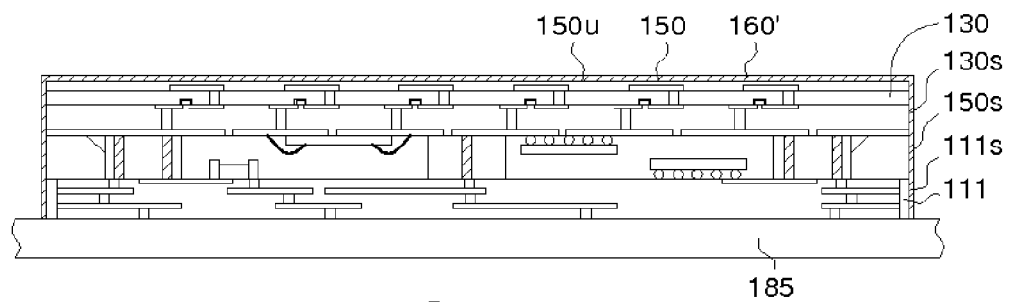
FIGS. 12A-12B illustrate manufacturing processes according to the semiconductor package of FIG. 5.
Figure 12B:
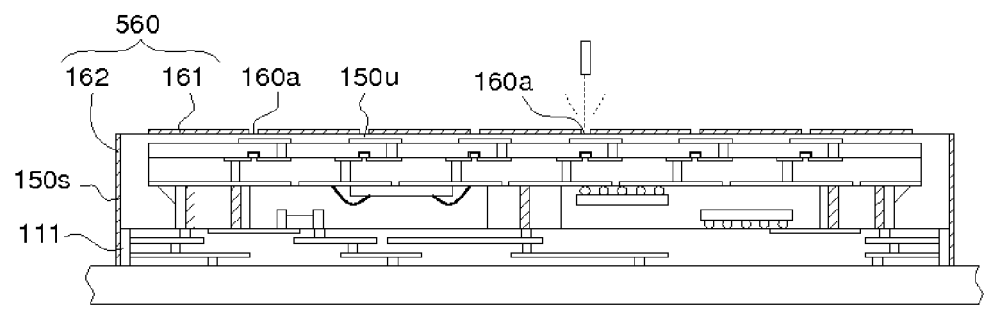

Referring to FIGS. 12A-12B, manufacturing processes according to the semiconductor package of FIG. 5 are illustrated.

Referring to FIG. 12A, an antenna material 160' is formed on the lateral surface 150s and the upper surface 150u of the package body 150, the lateral surface 130s of the substrate 130 and the lateral surface 111s of the grounding segment 111. The semiconductor package may be disposed on a carrier 185 when forming the antenna material 160'.

Referring to FIG. 12B, the first antenna layer 560 is formed by forming a plurality of slots 160a in the antenna material 160' using patterning technology, wherein a part of the package body 150 is exposed from slots 160a. Examples of the patterning technology for forming the slots 160a can include photolithography, chemical etching, laser drilling, or mechanical drilling.

In FIG. 12B, the first antenna layer 560 includes the grounding layer 161 and the irradiation layer 162 separated from the grounding segment 161, wherein the grounding layer 161 is formed on the lateral surface 150s of the package body 150 and the exposed grounding segment 111, and the irradiation layer 162 is formed on the upper surface 150u of the package body 150.

Referring to FIGS. 13A-13D, manufacturing processes according to the semiconductor package of FIG. 6 are illustrated.

Figure 13A:
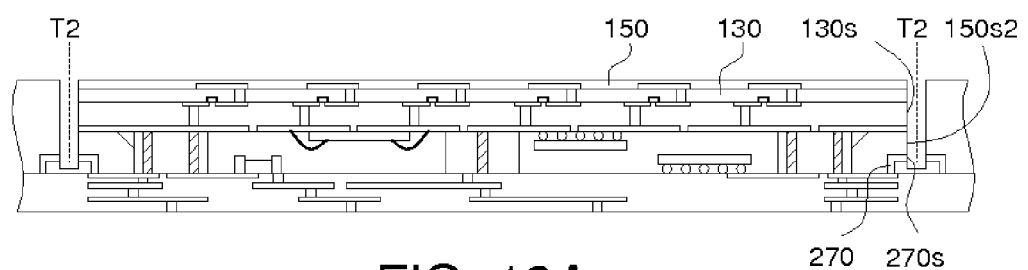
FIGS. 13A-13D illustrate manufacturing processes according to the semiconductor package of FIG. 6.

Referring to FIG. 13A, a number of first singulation paths T2 passing through the package body 150, the second substrate 130 and the electrical frame 270 are formed. The first singulation paths T2 are formed using a laser or another cutting tool, and the second lateral surface 150s2 of the package body 150, the lateral surface 130s of the second substrate 130 and the lateral surface 270s of the electrical frame 270 are formed. In the present embodiment of the invention, the singulation method is referred to as "half-cut method", that is, the first singulation paths T2 do not cut off the first substrate 110.

Figure 13B:
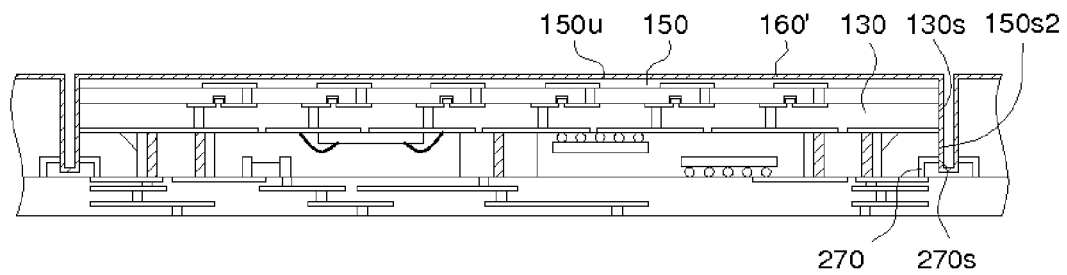

Referring to FIG. 13B, an antenna material 160' is formed on the second lateral surface 150s2 and the upper surface 150u of the package body 150, the lateral surface 130s of the second substrate 130 and the lateral surface 270s of the electrical frame 270. In addition, the antenna material 160' is a metal layer including such as aluminum, stainless, or copper and formed by patterned foil, plating, sputtering or other similar processes.

Figure 13C:
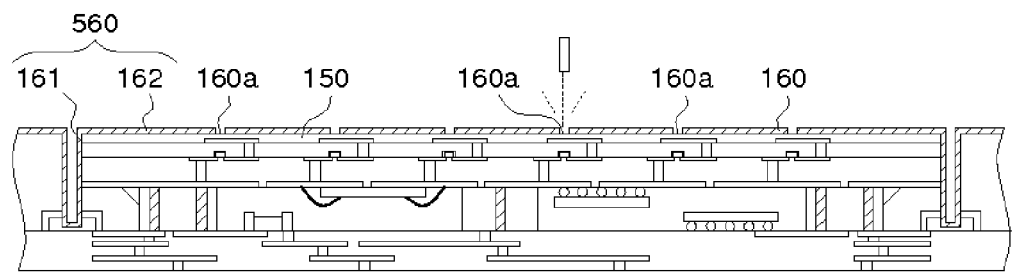

Referring to FIG. 13C, the first antenna layer 560 is formed by forming a plurality of slots 160a in the antenna material 160' using patterning technology, wherein a part of the package body 150 is exposed from slots 160a. Examples of the patterning technology for forming the slots 160a can include photolithography, chemical etching, laser drilling, or mechanical drilling.

In FIG. 13C, the first antenna layer 560 includes the grounding layer 161 and the irradiation layer 162 separated from the grounding segment 161, wherein the grounding layer 161 is formed on the second lateral surface 150s2 of the package body 150 and the exposed grounding segment 111, and the irradiation layer 162 is formed on the upper surface 150u of the package body 150.

Figure 13D:
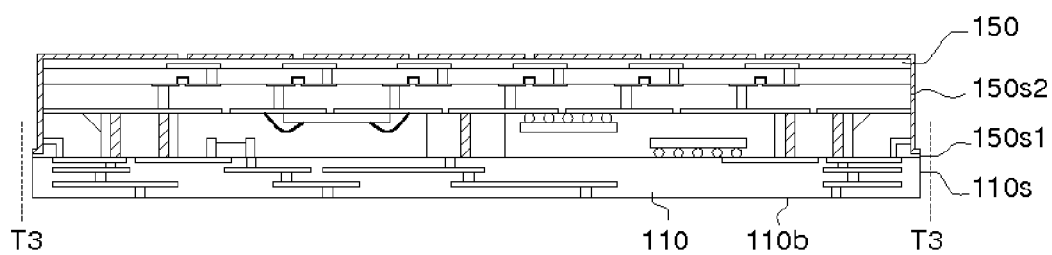

Referring to FIG. 13D, a number of second singulation paths T3 passing through the first substrate 110 are formed. The second singulation paths T3 are formed using a laser or another cutting tool, and the lateral surface 110s is thereupon formed on the first substrate 110. In addition, before or after the second singulation paths T3 are formed, an electrical contact 280 (illustrated in FIG. 6) may be formed adjacent to the lower surface 110b of the first substrate 110 so as to form the semiconductor package 600 illustrated in FIG. 6.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package comprising:
a first substrate including a ground layer;
an interposer disposed on an upper surface of the first substrate and having at least one opening;
a first die disposed in the at least one opening and coupled to the first substrate;
a second substrate coupled to the interposer, disposed over the first substrate and having an area less than an area of the first substrate;
a second die disposed on a lower surface of the second substrate;
a third die embedded within the second substrate;
an inductor disposed on an upper surface of the second substrate wherein the inductor is electrically connected to the second die and the third die;
a package body encapsulating portions of the first substrate, the interposer, the second substrate, the first die and the second die, the package body having a lateral surface and an upper surface; and
a metal layer disposed on the lateral surface and the upper surface of the package body wherein the metal layer is electrically connected to the first substrate and wherein the metal layer has voids that overlie the inductor.

2. The semiconductor package of claim 1, wherein the embedded third die has an active surface facing towards the first substrate.

3. The semiconductor package of claim 1, wherein the embedded third die has an active surface including bond pads which are exposed from the second substrate.

4. The semiconductor package of claim 3, further comprising a conductive path connecting the exposed bond pads with the inductor.

5. The semiconductor package of claim 1, further comprising an electrical frame, the electrical frame electrically connected to the ground layer and the metal layer.

6. The semiconductor package of claim 1, wherein the inductor is separated from the metal layer by the package body.

7. The semiconductor package of claim 1, wherein the voids determine a radiation distribution pattern.

8. The semiconductor package of claim 1, further comprising:
a dielectric layer covering the upper surface of the metal layer; and
a patterned metal layer formed on the dielectric layer.

9. A semiconductor package comprising:
a first substrate including a ground layer;
an interposer disposed on an upper surface of the first substrate;
a first die disposed in a space defined by the interposer and coupled to the first substrate;
a second substrate disposed over the first substrate and coupled to the interposer;
a second die disposed on a lower surface of the second substrate;
an inductor disposed on an upper surface of the second substrate and coupled to the second die;
a package body encapsulating portions of the first substrate, the interposer, the second substrate, the first die and the second die, the package body having a lateral surface and an upper surface; and
a metal layer disposed on the lateral surface and the upper surface of the package body wherein the metal layer is electrically connected to the first substrate and wherein the metal layer has voids that overlie the inductor.

10. The semiconductor package of claim 9, wherein the second substrate has an area less than an area of the first substrate.

11. The semiconductor package of claim 9, further comprising a third die embedded within the second substrate and electrically connected to the inductor and the second die.

12. The semiconductor package of claim 11, wherein the embedded third die has an active surface facing towards the first substrate.

13. The semiconductor package of claim 11, wherein the embedded third die has an active surface including bond pads which are exposed from the second substrate.

14. The semiconductor package of claim 13, further comprising a conductive path connecting the exposed bond pads with the inductor.

15. The semiconductor package of claim 9, further comprising an electrical frame, the electrical frame electrically connected to the ground layer and the metal layer.

16. The semiconductor package of claim 9, wherein the inductor is separated from the metal layer by the package body.

17. The semiconductor package of claim 9, wherein the voids determine a radiation distribution pattern.

* * * * *